(12) United States Patent
Portmann et al.

(10) Patent No.: US 9,484,856 B2
(45) Date of Patent: Nov. 1, 2016

(54) OSCILLATOR STARTUP

(71) Applicant: Google Inc., Mountain View, CA (US)

(72) Inventors: Clemenz Portmann, Los Altos, CA (US); Cheng-Yi Andrew Lin, Mountain View, CA (US); Shahriar Rabii, Palo Alto, CA (US)

(73) Assignee: GOOGLE INC., Mountain View, CA (US)

( * ) Notice: Subject to any disclaimer, the term of this patent is extended or adjusted under 35 U.S.C. 154(b) by 0 days.

(21) Appl. No.: 14/152,489

(22) Filed: Jan. 10, 2014

(65) Prior Publication Data

US 2015/0200625 A1    Jul. 16, 2015

(51) Int. Cl.
*H03K 3/03* (2006.01)
*H03B 5/06* (2006.01)
*H03L 7/23* (2006.01)
*H03B 27/00* (2006.01)
*H03L 7/24* (2006.01)
*H03B 5/36* (2006.01)

(52) U.S. Cl.
CPC ........ *H03B 5/06* (2013.01); *H03B 5/36* (2013.01); *H03B 5/362* (2013.01); *H03B 5/364* (2013.01); *H03B 27/00* (2013.01); *H03L 7/23* (2013.01); *H03L 7/24* (2013.01); *H03B 2200/0074* (2013.01)

(58) Field of Classification Search
CPC ....... H03L 7/0995; H03L 7/148; H03L 1/00; H03L 3/00; H03L 5/00; H03L 1/02; H03L 7/10; H03L 7/183; H03L 2207/06; H03L 7/087; H03L 7/18; H03L 7/24; H03B 5/06; H03B 5/36; H03B 2200/0094; H03B 5/364; H03B 5/368; H03B 5/32
USPC ......... 331/2, 46, 47, 158, 116 R, 116 FE, 55
See application file for complete search history.

(56) References Cited

U.S. PATENT DOCUMENTS

| | | | |
|---|---|---|---|
| 6,057,742 A * | 5/2000 | Prado | H03L 3/00 331/116 FE |
| 6,639,479 B2 | 10/2003 | Kappes et al. | |
| 6,819,195 B1 * | 11/2004 | Blanchard et al. | 331/173 |
| 6,977,557 B1 * | 12/2005 | Frerking | H03L 7/24 331/158 |
| 7,482,888 B1 * | 1/2009 | Kleveland | 331/173 |
| 7,558,086 B2 | 7/2009 | Cheng | |
| 2005/0083139 A1 * | 4/2005 | Gazit | H03B 5/36 331/158 |

* cited by examiner

*Primary Examiner* — Arnold Kinkead
(74) *Attorney, Agent, or Firm* — Morris & Kamlay LLP

(57) ABSTRACT

A modulated signal based on a low-precision, fast startup oscillator is provided to a circuit with a high-precision, slow startup oscillator. The frequency of the modulated signal ranges around the characteristic or resonant frequency of the high precision oscillator without using feedback from the high precision oscillator circuit. An implementation can include one or more variable gain circuits that can be adjusted based on an amplitude threshold in relation to the output signal of the high precision oscillator circuit.

20 Claims, 4 Drawing Sheets

OSCILLATOR STARTUP

BACKGROUND

A crystal oscillator is an electronic oscillator circuit that uses the mechanical resonance of a vibrating crystal to create an electrical signal with precise frequency. There are several different types of crystal oscillators each having different features relating to frequency management and control.

A crystal oscillator can be used to generate a clock signal that can be used for timing purposes in integrated circuits. The operation of a crystal oscillator can be broken down into two phases: startup and steady-state operation. The time from startup to steady-state operation can be referred to as the startup time of the crystal oscillator.

Crystal oscillator startup times are generally a function load capacitance and feedback gain of the circuits of which the crystal oscillator is a part. High-precision clocks based on crystal oscillators typically have long startup times.

Resistive-capacitive (RC) oscillators generally have a faster startup time than crystal oscillators. However, RC oscillators are generally not as precise as crystal oscillators and the frequency of a signal generated by a RC oscillator tends to be sensitive to changes in voltage, temperature and other effects. Ring oscillators based on inverters can also be used.

BRIEF SUMMARY

According to implementations of the disclosed subject matter, a signal based on a low precision, fast startup oscillator is provided to a high precision, slower startup oscillator circuit. The high precision oscillator in the high precision oscillator circuit can have a predetermined resonant frequency. The signal based on the low precision oscillator can be modulated to range over frequencies around the predetermined resonant frequency of the high precision oscillator. This can be accomplished without feedback from the high precision oscillator because its resonant frequency is known, and a modulating subsystem can tune the signal based on the low precision oscillator appropriately. The high precision oscillator can be a crystal oscillator and the low precision oscillator can be a RC oscillator.

The modulating subsystem can tune the modulated signal based on digital or analog input. The digital input can include a digital modulation code of N bits, where each code corresponds to a particular frequency. The modulated signal can also be tuned based on feedback from a sigma-delta loop.

The high precision oscillator circuit can include at least one variable gain circuit for controlling gain. A variable gain circuit can include a transistor and a variable current source or an inverter biased to serve as an amplifier. The variable gain circuit can increase the gain if the amplitude of an output signal from the high precision oscillator circuit is below an amplitude threshold, for example, shortly after startup. The variable gain circuit can also reduce the gain if the amplitude of the output signal exceeds a threshold, such as at the end of the startup period.

Additional features, advantages, and implementations of the disclosed subject matter may be set forth or apparent from consideration of the following detailed description, drawings, and claims. Moreover, it is to be understood that both the foregoing summary and the following detailed description include examples and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate implementations of the disclosed subject matter and together with the detailed description serve to explain the principles of implementations of the disclosed subject matter. No attempt is made to show structural details in more detail than may be necessary for a fundamental understanding of the disclosed subject matter and various ways in which it may be practiced.

DETAILED DESCRIPTION

Figure 1:
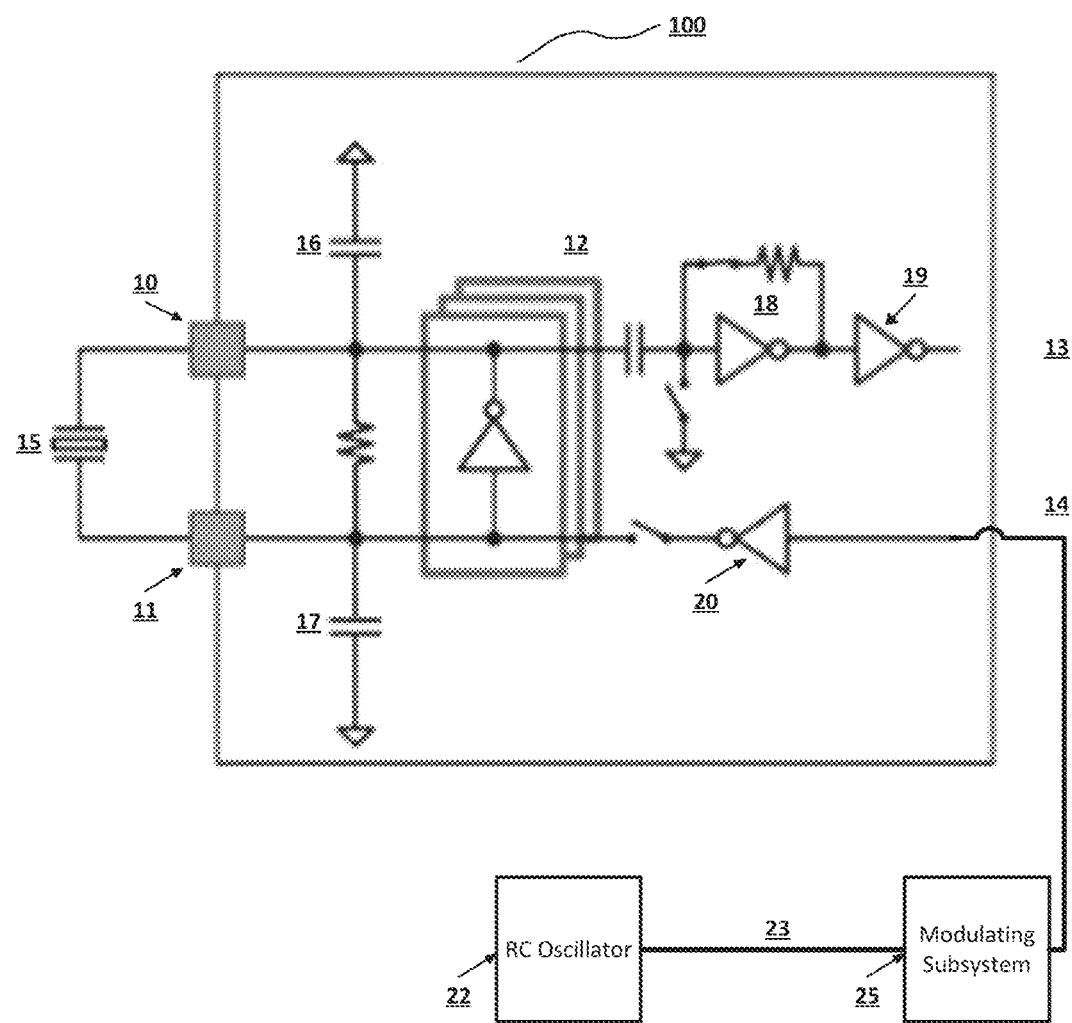
FIG. 1 shows a system according to an implementation of the disclosed subject matter.

An implementation in accordance with the disclosed subject matter can provide a signal based on a low-precision, fast-startup oscillator (such as a RC oscillator) to a high-precision, slow-startup oscillator (such as a crystal oscillator) to create a fast startup, high-precision crystal oscillator. The frequency of the signal provided to the crystal oscillator can be modulated around a predetermined resonant frequency of the crystal oscillator without relying on feedback from the crystal oscillator circuit. Implementations of the disclosed subject matter can reduce startup time for a high precision oscillator to 100 microseconds or less. Startup can generally be the elapsed time from when the high precision oscillator circuit is first called upon until the time it achieves a steady-state output signal.

Implementations of the disclosed subject matter may be used in circuits that require fast wakeups, such as in mobile systems and/or systems that rely on battery power. For example, such systems can include RF switches, processors, graphics chipsets and other components that can operate in a power conservation mode, such as when idle or in a low-demand mode using no clock signal or a slower clock signal or a low-accuracy clock signal. When demand increases, the component needs to switch to a different, more active state in which it may need a new clock signal or a higher speed clock signal. The new clock signal should become available as soon as possible after it is first needed. An implementation of the disclosed subject matter can reduce the startup time needed for a new clock signal to permit a component or circuit to operate in a more active mode. A quicker startup time generally supports the use of power management techniques such as idle or lower activity states. Implementations can thus contribute to the conservation of battery power and/or may also reduce overheating by permitting components to operate in lower power modes.

A crystal oscillator circuit can have very high quality factor (Q factor) and may operate in a narrow frequency range. The frequency of the signal based on the lower precision, faster startup oscillator can be modulated to a range around the resonant frequency of the crystal oscillator.

The injected oscillator can have energy within hundreds of parts-per-million (ppm) (around 0.0001%) of the crystal oscillator to assist startup.

It can be difficult to create RC oscillators with precisions in the hundreds of parts-per-million. Trimming is possible, but the RC oscillator may typically have frequency variation of 20-30%. Trimming the RC oscillator to a precision of hundreds of parts-per-million would require trimming on the order of 12 bits, which is equivalent to 4096 codes.

An implementation of the disclosed subject matter can apply frequency modulation to the signal generated by the RC oscillator so that the RC oscillations occur over a range of frequencies around the resonant frequency and thus inject energy into the crystal oscillator at approximately the desired frequency. For example, a crystal may operate at 26 MHz with a variance of 40 ppm, and an RC oscillator can be trimmed to 1% of 26 MHz. The crystal would thus be operating between 25.999 MHz and 26.001 MHz. The RC oscillator can be trimmed to 25.74 MHz or 26.26 MHz. If the RC oscillator frequency can be modulated +/−1% slowly, at some point the RC oscillator will inject energy at exactly the right frequency for the crystal oscillator.

Frequency modulation of the RC oscillator can be accomplished with digital or with analog mechanisms. A digital implementation can use the digital codes of the trimming circuit to vary the frequency. Digital modulation may be done using a random variation of digital codes or with a sigma-delta loop to provide feedback to the modulation. An analog implementation can have a second RC oscillator that can modulate a signal from the first RC oscillator.

For example, with reference to FIG. 1, a modulated signal 14 from a modulating subsystem 25 based on the output 23 of a RC oscillator 22 can be provided to a crystal oscillator circuit 100 that can produce a crystal oscillator circuit output signal 13. Signal 13 can be used by a circuit (not shown) for timing purposes.

The crystal oscillator circuit 100 can include a crystal oscillator 15 having two terminals 10 and 11 that can be coupled to a variable gain variable gain circuit 12. A variable number of variable gain circuits 12 can be connected to the crystal 15 in parallel to vary the gain of the circuit 100. The crystal oscillator circuit 100 can also include coupling capacitors 16 and 17, as well as amplifier 18 and inverters (buffers) 19 and 20.

Figure 2A:
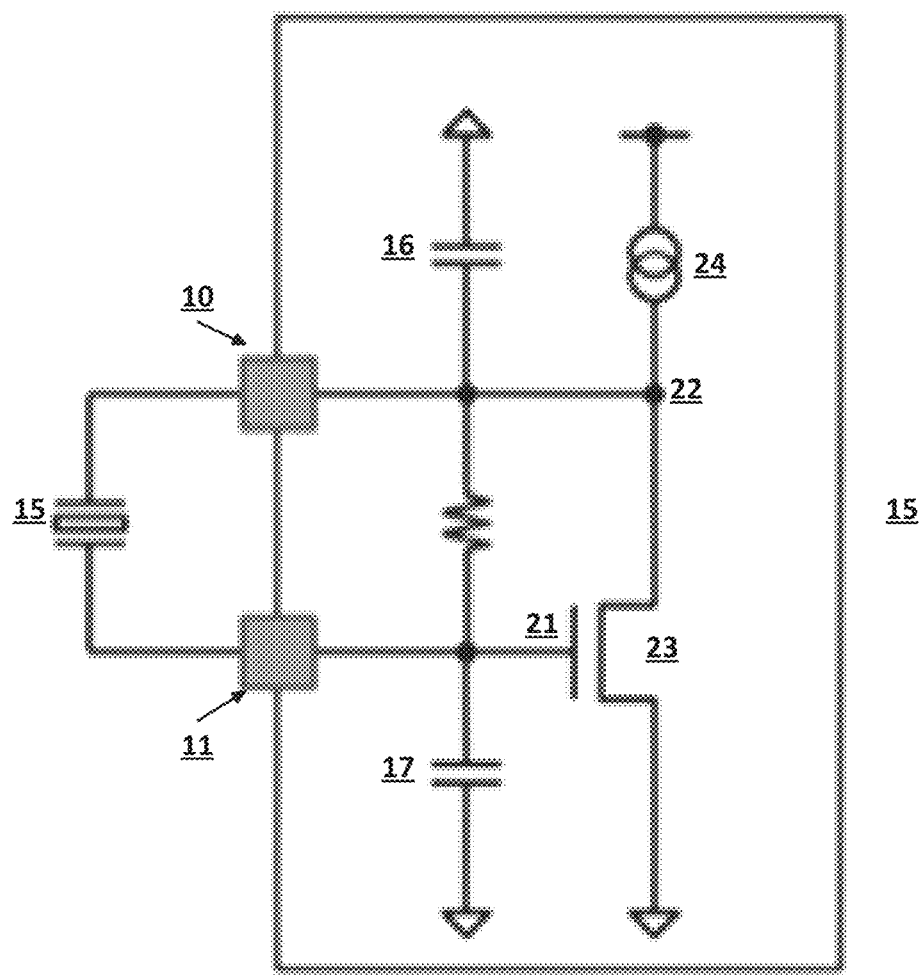
FIG. 2A shows a system diagram of an oscillator according to an implementation of the disclosed subject matter.

An implementation of a variable gain variable gain circuit is shown in FIG. 2A. The output terminals 10 and 11 of the crystal oscillator 15 are in communication with the input 21 and 22 of a transistor 23. The biasing of the transistor may be based on a DC variable current source 24.

Figure 2B:
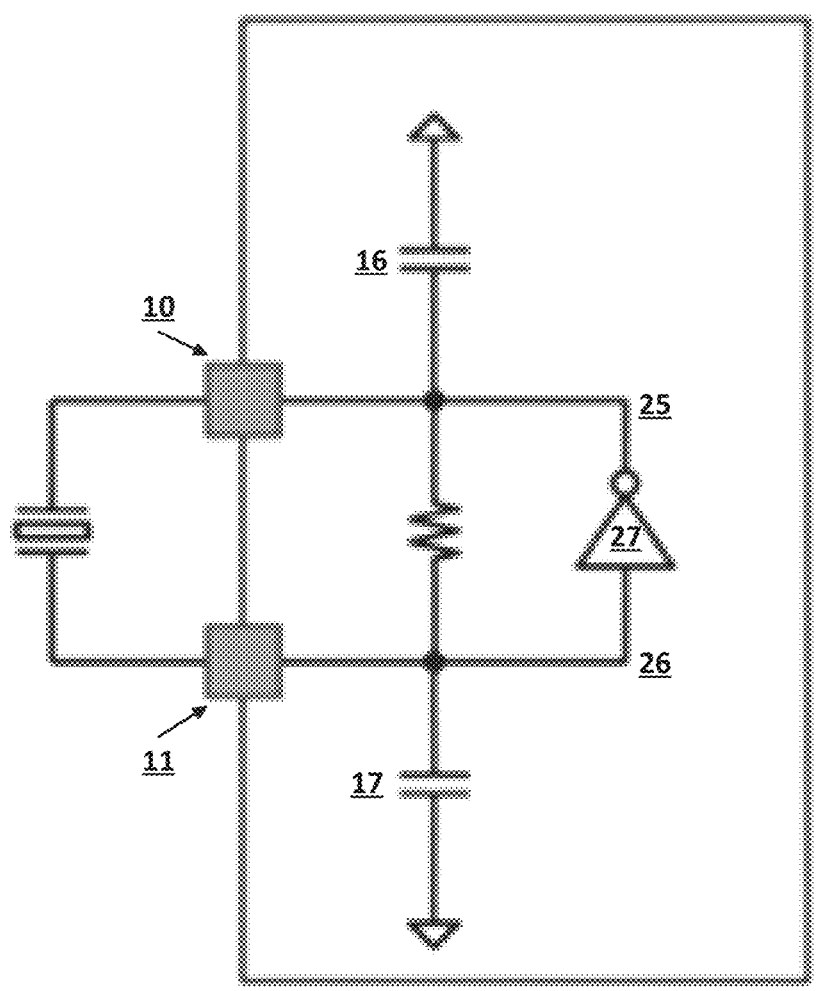
FIG. 2B shows a system diagram of an oscillator according to an implementation of the disclosed subject matter.

Another implementation of a variable gain variable gain circuit is shown in FIG. 2B. The output terminals 10 and 11 of the crystal oscillator 15 are in communication with the terminals 25 and 26 of an inverter 27. The inverter can be biased for use as an amplifier.

Figure 3:
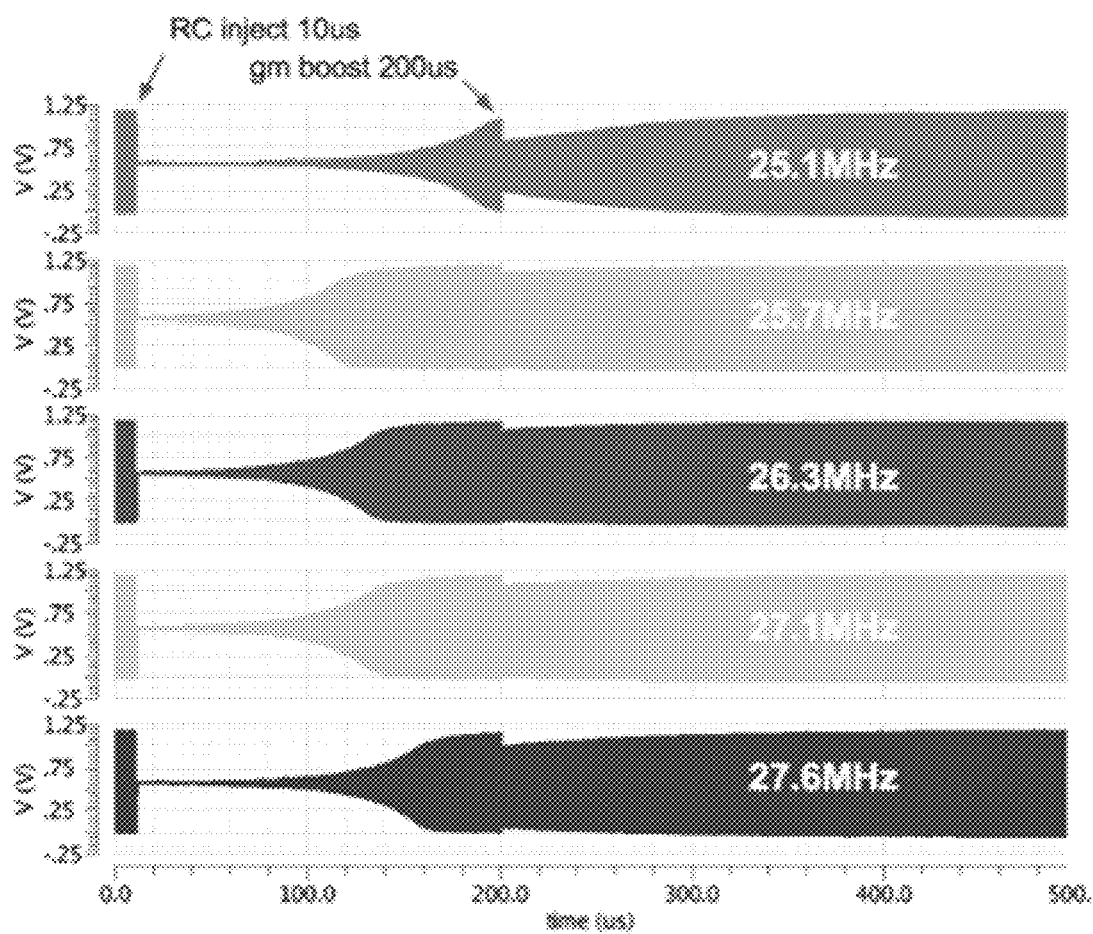
FIG. 3 shows experimental results relating to an implementation of the disclosed subject matter.

FIG. 3 shows experimental results of an implementation in accordance with the disclosed subject matter. A modulated signal based on a signal from a low precision oscillator was provided to the high precision oscillator circuit for 10 microseconds. The gain of the transistor in the oscillator circuit was adjusted until a threshold amplitude was reached in the output signal of the high precision oscillator circuit at 200 microseconds. Steady state was achieved more quickly by the implementation than the high precision oscillator circuit would have been capable of without the input of the modulated signal based on the low precision oscillator circuit. Implementations of the disclosed subject matter can attain steady state in 100 microseconds or less.

An implementation can include a first oscillator circuit having a first oscillator. The first oscillator can have a predetermined resonant frequency. For example, a crystal oscillator can have a characteristic resonant frequency that is known. A second oscillator can be in communication with the first oscillator through a modulating subsystem. The second oscillator can have a faster startup time and can operate with less precision than the first oscillator. An example of a second oscillator is a RC oscillator. The modulating subsystem can provide to the first oscillator a modulated signal based on a signal from the second oscillator. The modulated signal can have a frequency around the predetermined resonant frequency of the first oscillator.

The modulating subsystem can tune the signal provided by the second oscillator to a frequency within a threshold frequency range of the predetermined resonant frequency of the first oscillator. For example, as discussed above, the first oscillator may operate at 26 MHz with a variance of 40 ppm, and the modulated signal can be trimmed to 1% of 26 MHz. The modulated signal based on the second oscillator can be trimmed to 25.74 MHz or 26.26 MHz. As the modulated signal is trimmed around the threshold +/−1%, at some point the RC oscillator will inject energy at exactly the right frequency for the first oscillator. In various implementations, any frequency range may be accommodated. In some implementations, the threshold range can be from about 0.5% to about 5%.

The modulated signal can be tuned based on a digital frequency modulation code. For example, a four-bit code that corresponds to a frequency within the frequency range can cause the modulating subsystem to tune the modulated signal based on the second oscillator to approximately a corresponding frequency. A signal can be tuned in frequency, amplitude and/or phase.

Likewise, the frequency of the modulated signal can be tuned based on an analog frequency modulation signal. In an implementation, the frequency of the modulated signal can be based on a feedback signal from a sigma-delta loop.

In an implementation, a third oscillator can be in communication with the modulating subsystem. The modulating subsystem can tune the frequency of the modulated signal based on a signal from the third oscillator.

An implementation of the first oscillator circuit can include a variable gain circuit that can adjust the gain of the first oscillator, where a first terminal of the first oscillator is coupled to an input of a transistor and a second terminal of the first oscillator is coupled to an output of a transistor. The biasing of the transistor may be based on a DC variable current source. Another implementation can include an inverter that can be biased to act as an amplifier. One terminal of the first oscillator can be coupled to an input of the inverter, while the second terminal of the first oscillator can be coupled to the output of the inverter.

An implementation of the first oscillator circuit can include one or more variable gain circuits (such as the inverter-based variable gain circuit shown in FIG. 2B) that can be selectively coupled to the terminals of the first oscillator in parallel. The gain of the first oscillator circuit can be increased as more variable gain circuits are recruited to be connected and decreased as fewer variable gain circuits are connected to the first oscillator.

In an implementation, the second oscillator can include a RC oscillator having a capacitor coupled to a power source and/or a Schmitt trigger and a resistor. Other implementations can include a ring oscillator loaded with resistors and/or capacitors, an IC oscillator, e.g., with current charging a capacitor and including a comparator for resets. Any suitable low precision oscillator can be used in accordance with the disclosed subject matter.

An implementation can generate a signal from a second oscillator to produce a second oscillator signal and modulate the second oscillator signal to produce a modulated signal. The modulated signal can have a frequency that is within a threshold range of a predetermined resonant frequency of a first oscillator to produce a modulated signal. The threshold range can be a percentage difference of the resonant frequency (for example, +/−1%), a fixed frequency variation around the resonant frequency (for example, +/−0.25 MHz), or any other suitable measure of variation. The modulated signal can be provided to the first oscillator.

An implementation can determine an amplitude of an output signal of a first oscillator circuit and determine that the amplitude of the first oscillator output signal is greater than or less than an amplitude threshold. The implementation can adjust the gain of a first oscillator circuit based on the determining that the amplitude of the first oscillator output signal is greater than or less than the amplitude threshold. The amplitude threshold can be any value, but in some implementations, the amplitude threshold can have a value of, say, a given percentage of the steady state amplitude. The amplitude threshold can be, for example, 80%, 85%, 90% or 95% (or any acceptable percentage) of the steady state amplitude. Threshold amplitude can also be specified in volts. Threshold amplitude can be, for example, 0.5 volt, 1 volt, 1.5 volts or any suitable voltage. For example, the amplitude of the output signal may be below an amplitude threshold (which can be a range of acceptable amplitudes) just after startup and the gain can be increased until the amplitude threshold is reached. Likewise, the output signal can exceed an amplitude threshold later after startup (for example, 100 microseconds-250 microseconds after startup) and the gain can be reduced.

In an implementation, the frequency of the modulated signal can be set digitally, based for example on a digital modulation code. Each digital modulation code can correspond to a particular frequency. Likewise, the frequency of the modulated signal can be set in response to an analog frequency modulation signal. In an implementation, the frequency of the modulated signal is set based on a feedback signal from a sigma-delta loop.

The foregoing description, for purpose of explanation, has been described with reference to specific implementations. However, the illustrative discussions above are not intended to be exhaustive or to limit implementations of the disclosed subject matter to the precise forms disclosed. Many modifications and variations are possible in view of the above teachings. The implementations were chosen and described in order to explain the principles of implementations of the disclosed subject matter and their practical applications, to thereby enable others skilled in the art to utilize those implementations as well as various implementations with various modifications as may be suited to the particular use contemplated.

The invention claimed is:

1. A system comprising:
   a first oscillator circuit having a first oscillator, the first oscillator having a predetermined resonant frequency; and
   a second oscillator in communication with the first oscillator through a modulating subsystem, the modulating subsystem providing to the first oscillator a modulated signal based on a signal from the second oscillator, the modulated signal having a frequency around the predetermined resonant frequency of the first oscillator, wherein the signal from the second oscillator is modulated to range over a range of frequencies around the frequency of the signal from the second oscillator, wherein the range of frequencies is from about +/−0.5% of the frequency of the signal from the second oscillator to about +/−5% of the frequency of the signal from the second oscillator, to produce the modulated signal.

2. The system of claim 1, wherein the first oscillator is a crystal oscillator and the second oscillator includes at least one from the group of a RC oscillator, a ring oscillator and an IC oscillator.

3. The system of claim 1, wherein the frequency of the modulated signal is based on an analog frequency modulation signal.

4. The system of claim 1, wherein the frequency of the modulated signal is based on a feedback signal from a sigma-delta loop.

5. The system of claim 1, further comprising a third oscillator in communication with the modulating subsystem and wherein the modulated signal is based on a signal from the third oscillator.

6. The system of claim 1, further comprising a variable gain circuit adapted and configured to adjust the gain of the first oscillator circuit.

7. The system of claim 6, wherein the variable gain circuit comprises a transistor having an input and an output and the first oscillator comprises a first terminal and a second terminal, the first terminal coupled to the input of the transistor and the second terminal coupled to the output of the transistor.

8. The system of claim 6, wherein the variable gain circuit comprises at least one inverter having an input and an output and the first oscillator comprises a first terminal and a second terminal, the first terminal coupled to the input of the at least one inverter, the second terminal coupled to the output of the at least one inverter, the inverter biased to be used as an amplifier.

9. The system of claim 2, wherein the RC oscillator comprises a capacitor coupled to a power source.

10. The system of claim 2, wherein the RC oscillator comprises a Schmitt trigger and a capacitor.

11. A method, comprising:
   generating a signal from a second oscillator to produce a second oscillator signal;
   modulating the second oscillator signal to produce a modulated signal within a threshold range of a predetermined resonant frequency of a first oscillator, wherein modulating the second oscillator signal comprises modulating the second oscillator signal to range over a range of frequencies around the frequency second oscillator signal to produce the modulated signal, wherein the range of frequencies is from about +/−0.5% of the frequency of the signal from the second oscillator to about +/−5% of the frequency of the signal from the second oscillator; and
   providing the modulated signal to a first oscillator circuit.

12. The method of claim 11, further comprising:
   determining an amplitude of an output signal of the first oscillator circuit;
   determining that the amplitude of the first oscillator circuit output signal is greater than or less than an amplitude threshold; and
   adjusting a gain of the first oscillator circuit based on the determining that the amplitude of the first oscillator output signal is greater than or less than the amplitude threshold.

13. The method of claim 11, wherein the first oscillator is a crystal oscillator and the second oscillator is a RC oscillator.

14. The method of claim 12, wherein the amplitude threshold is a given percentage of a steady state amplitude of the first oscillator output signal.

15. The method of claim 11 further comprising receiving a digital frequency modulation code.

16. The method of claim 11, wherein the modulating the second oscillator signal comprises analog modulation.

17. The method of claim 16, further comprising receiving an analog frequency modulation signal.

18. The method of claim 17 further comprising receiving a feedback signal from a sigma-delta loop.

19. The method of claim 1, wherein the frequency of the modulated signal is based on a digital frequency modulation code.

20. The method of claim 11, wherein the modulating the second oscillator signal comprises digital modulation.

\* \* \* \* \*